(12) United States Patent
Chan et al.

(10) Patent No.: US 7,710,105 B2
(45) Date of Patent: May 4, 2010

(54) CIRCUIT RESET TESTING METHODS

(75) Inventors: Johnny Chan, Fremont, CA (US);
Philip S. Ng, Cupertino, CA (US);
James Hughes, Colorado Springs, CO (US)

(73) Assignee: Atmel Corporation, San Jose, CA (US)

( * ) Notice: Subject to any disclaimer, the term of this patent is extended or adjusted under 35 U.S.C. 154(b) by 179 days.

(21) Appl. No.: 11/375,838

(22) Filed: Mar. 14, 2006

(65) Prior Publication Data
US 2007/0216397 A1    Sep. 20, 2007

(51) Int. Cl.
*G01R 7/00*    (2006.01)
*H03L 7/00*    (2006.01)

(52) U.S. Cl. .................... 324/142; 327/143
(58) Field of Classification Search .............. None
See application file for complete search history.

(56) References Cited

U.S. PATENT DOCUMENTS

| | | | | |
|---|---|---|---|---|
| 5,180,926 A * | 1/1993 | Skripek | ...................... | 327/143 |
| 5,181,203 A | 1/1993 | Frenkil et al. | | |
| 5,203,000 A * | 4/1993 | Folkes et al. | ................ | 713/340 |
| 5,345,424 A * | 9/1994 | Landgraf | ..................... | 365/227 |
| 5,349,290 A | 9/1994 | Yamada | .................... | 324/158.1 |
| 5,450,417 A * | 9/1995 | Truong et al. | ............... | 714/724 |
| 5,778,238 A | 7/1998 | Hofhine | | |
| 5,809,312 A * | 9/1998 | Ansel et al. | ................. | 713/300 |
| 6,137,324 A * | 10/2000 | Chung | ........................ | 327/143 |
| 6,188,257 B1 * | 2/2001 | Buer | ........................ | 327/143 |
| 6,236,249 B1 * | 5/2001 | Choi et al. | .................. | 327/143 |
| 6,259,286 B1 * | 7/2001 | Papaliolios | ................. | 327/143 |
| 6,329,852 B1 * | 12/2001 | Seo | ............................ | 327/143 |
| 6,407,571 B1 * | 6/2002 | Furuya et al. | ............... | 324/765 |
| 6,473,852 B1 * | 10/2002 | Hanjani | ........................ | 713/1 |

(Continued)

FOREIGN PATENT DOCUMENTS

| JP | 2004260648 A * | 9/2004 |
|---|---|---|
| WO | WO 07115120 A2 | 10/2007 |

OTHER PUBLICATIONS

"U.S. Appl. No. 11/278,223 Response filed Jul. 15, 2008 to Non-Final Office Action mailed Apr. 15, 2008", 10 pages.

(Continued)

*Primary Examiner*—Jermele M Hollington
(74) *Attorney, Agent, or Firm*—Schwegman, Lundberg & Woessner, P.A.

(57) ABSTRACT

A method of testing power-on reset circuitry in an integrated circuit comprises establishing the a first state of the integrated circuit that is different from a normal reset state of the circuit, lowering the VCC power supply voltage from a normal high operating level $V_H$ to a specified lower level $V_P$ then raising it back to the normal high level, then determining whether or not the integrated circuit has assumed the reset state. The testing can repeated with a plurality of lower VCC levels $V_P$ and under a variety of operating conditions to characterize resetting parameters and to designate pass/fail results for individual chips. If an AC voltage detector is part of the power-on reset circuitry, then it can tested separately, and DC testing occurs with very slow ramp rates for lowering and raising the power supply voltage.

23 Claims, 2 Drawing Sheets

U.S. PATENT DOCUMENTS

| | | | |
|---|---|---|---|
| 6,515,523 B1* | 2/2003 | Bikulcius | 327/142 |
| 6,728,891 B2* | 4/2004 | Hanjani | 324/765 |
| 6,947,863 B2* | 9/2005 | Seitz | 324/537 |
| 7,015,732 B1* | 3/2006 | Holloway et al. | 327/143 |
| 7,091,758 B2* | 8/2006 | Chun et al. | 327/143 |
| 7,519,486 B2 | 4/2009 | Ng et al. | |
| 2004/0041601 A1* | 3/2004 | Payne et al. | 327/143 |
| 2005/0035796 A1* | 2/2005 | Chun et al. | 327/143 |
| 2005/0190627 A1* | 9/2005 | Nakatake et al. | 365/226 |
| 2006/0041811 A1 | 2/2006 | Hsieh | 714/742 |
| 2007/0080726 A1* | 4/2007 | Khan et al. | 327/143 |
| 2007/0252626 A1* | 11/2007 | Chou | 327/143 |
| 2007/0266280 A1 | 11/2007 | Ng et al. | |
| 2008/0246509 A1* | 10/2008 | Xiao et al. | 326/39 |
| 2009/0102522 A1* | 4/2009 | Tang et al. | 327/143 |
| 2009/0193305 A1* | 7/2009 | Liu et al. | 714/727 |

OTHER PUBLICATIONS

"U.S. Appl. No. 11/278,223 Non-Final Office Action mailed Apr. 15, 2008", 8pgs.

Khan, et al., "A Sequence Independent Power-On-Reset Circuit for Multi-Voltage Systems", (Jan. 2006), 1271-1274.

Vilalte, "Circuit Design of the Power-On-Reset", (Apr. 2000), 1-25.

"U.S. Appl. No. 11/278,223, Notice of Allowance mailed Nov. 28, 2008", 10 pgs.

"International Application Serial No. PCT/US2007/65539, International Search Report and Written Opinion mailed Aug. 18, 2008", 9 pgs.

* cited by examiner

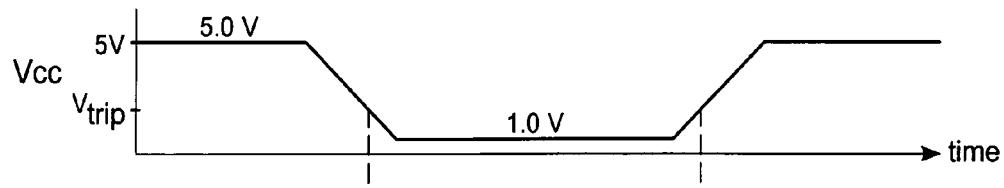
*Fig._2A*
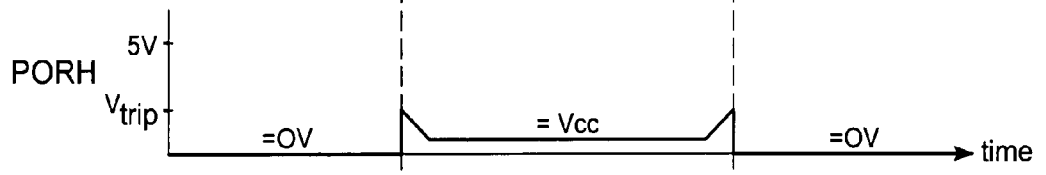
*Fig._2B*
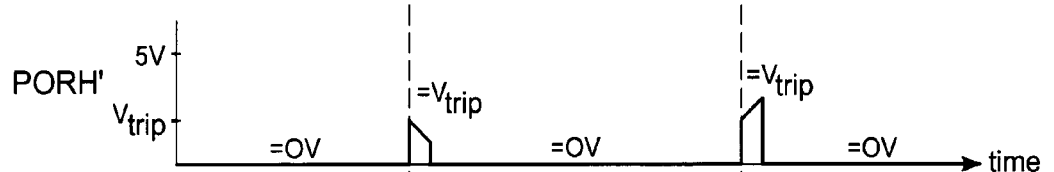
*Fig._2C*
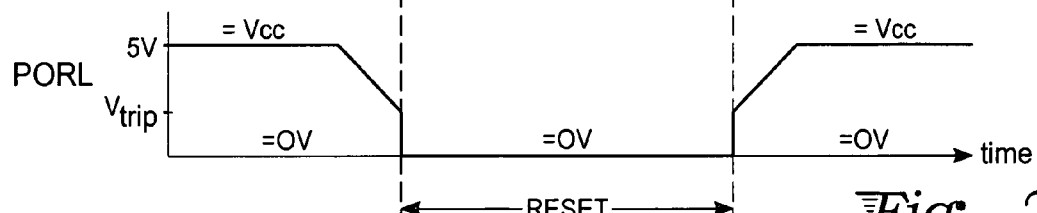
*Fig._2D*
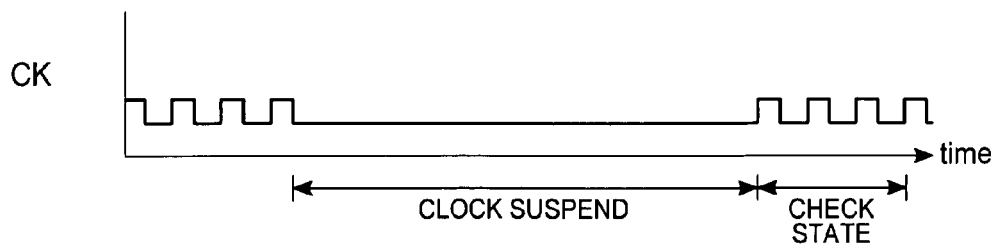
*Fig._2E*

CIRCUIT RESET TESTING METHODS

TECHNICAL FIELD

The present invention generally relates to integrated circuit in-production testing methods, and also to on-chip power-up circuitry for providing a reset capability to the rest of the integrated circuit.

BACKGROUND ART

When an integrated circuit is powered up, it is often critical that the circuit be set to a known state. Otherwise, if the circuit's state were some undefined, unexpected, or undesirable state, the resulting behavior could be incorrect. A power-on reset (POR) circuit is typically provided on such chips to provide resetting capability to the receiving circuit. The POR circuit generally includes some form of voltage detector monitoring the power supply (VCC) pin of the chip, so as to generate a reset signal under appropriate conditions.

A chip in production is normally tested to ensure that it functions correctly before it is delivered to a customer. In order to reduce testing time, the test equipment typically provides very fast rise and fall times to the pins of the chip, including the VCC pin. Under these testing conditions, the voltage detector will naturally generate a reset signal on power-up, so that the receiving circuit of the chip under test will be reset to a known state. The circuit operation will test correctly and receive a pass/fail result based on its subsequent behavior during the test.

However, VCC rise or fall characteristics at the customer end are generally unpredictable, even if constrained somewhat by parameter requirements published in product data sheets. In any case, normal VCC rise and fall times are generally slower than the test conditions. Moreover, the voltages of a power supply signal in a test typically range from full off (0V) to full on (a nominal high voltage level $V_H$), which may differ somewhat from a customer's normal operating environment or in abnormal or unusual circumstances. Thus, we need a way to test the on-chip POR circuit itself, and not just the receiving circuit, in order to ensure that a reset will occur under any of the VCC power supply conditions that can be expected to occur in a user environment. It may be necessary to better characterize the reset trip point and identify voltage conditions of the chip under test when a reset might fail to occur or might improperly occur.

U.S. Pat. No. 5,450,417 to Truong et al. describes an on-chip test circuit for testing the power-on reset circuitry in integrated circuits. In particular, the test circuit includes a pair of latches to detect the occurrence of a power-on reset signal pulse.

U.S. Patent Application Publication No. 2006/0041811 to Hsieh describes a circuit comprising two variable resistors and a jumper with four pins, all disposed on a test board, for testing the power down reset function of an electronic device.

SUMMARY DISCLOSURE

A method is provided for testing the on-chip VCC detector and the receiving circuit's resetting capabilities under a variety of VCC power supply conditions, including very slow rise and fall rates, and VCC supply voltage drops to specified levels not limited to completely off. The method begins with the chip state cycled to some known state other than the known reset state. The power supply voltage provided on the chip's VCC pin begins at a normal high level $V_H$ and is lowered very slowly to a specified level $V_P$. If $V_P$ is lower than the VCC detector's trip point ($V_{trip}$), the receiving circuitry should be reset to a known reset state when the VCC voltage is raised back to its original level. If $V_P$ is higher than $V_{trip}$, a reset will not be triggered. If the reset circuit fails to generate a reset signal, or if the circuit receiving the reset signal fails to reset or resets to an improper state, then monitoring for changes in the chip state during the lowering and raising of the supply voltage VCC can reveal this. This test can be repeated with a plurality of $V_P$ test values in order fully characterize $V_{trip}$ and identify conditions in which a reset fails to occur. It can also provide a pass/fail result for the chip.

BRIEF DESCRIPTION OF THE DRAWINGS

FIGS. 2A-2E are timing graphs of power supply voltage VCC, three different embodiments of a power-on reset signal PORH, PORH' and PORL that are generated by various POR circuits, and a clock signal CK, all versus time for a lowering and raising of VCC in accord with the present invention. A high level $V_H$=5V, and a lowering to a level $V_P$=1V below a trip point $V_{trip}$ of 1.5V is used as an example.

DETAILED DESCRIPTION

Figure 1:
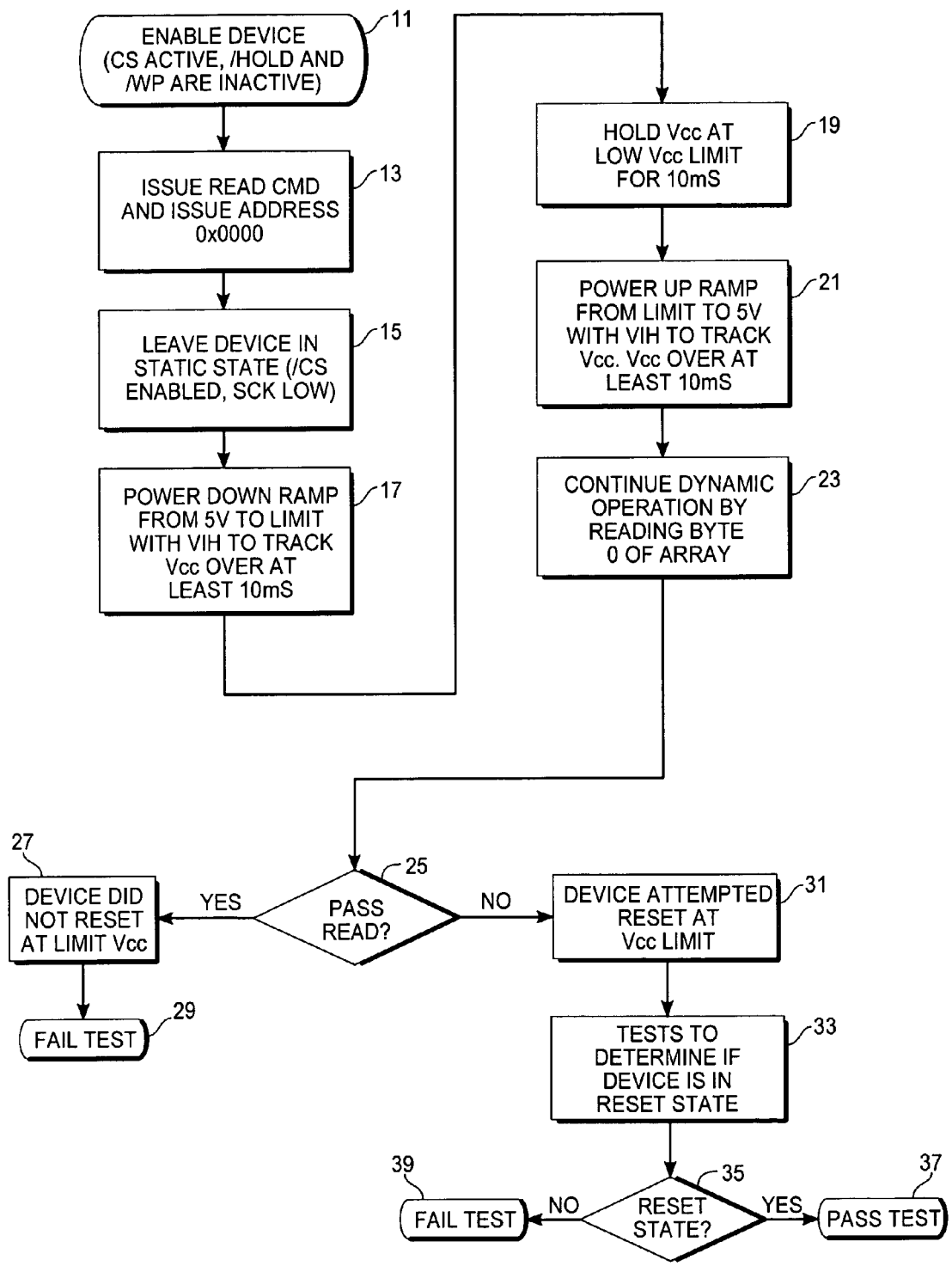
FIG. 1 is a flow diagram of an exemplary test flow implementing an embodiment of the reset testing method.

A POR circuit typically has VCC detection circuitry, which may include both AC and DC detectors. Such detectors monitor the power supply voltage (VCC) and the POR circuit will generate a reset signal under specified circumstances, including power-up of the integrated circuit. Provided the circuitry receiving this reset signal properly resets to a specified reset state, the chip should then function as designed. VCC detectors of the AC type are naturally triggered under the very fast VCC power supply rise time that is provided in the usual testing of a chip's operational behavior. Any failure of the chip to reset under these typical test conditions will be readily detectable. Thus, only the DC portion of the POR circuit remains untested.

The invention can also be used with POR circuits having only a DC voltage detector. DC voltage detectors generally have some specified trip point, such that, if the power supply voltage is lowered to below the trip point, a reset will be normally triggered. Normal testing provides a power supply transition from completely off (VCC=0V) to completely on (VCC=$V_H$) which should cause a reset to occur. However, other power supply conditions, including partial drops in VCC not completely down to 0V, may or may not trigger a reset, and need to be tested.

Additionally, the mere generation of a reset pulse in response to the voltage detector(s) does not necessarily guarantee a successful reset. A full test as provided by the present invention will determine whether a chip actual assumes a proper reset state.

In order to test a DC VCC detector and any response by the receiving circuit to a reset signal, very slow rise and fall times are employed in order not to trigger a reset by any AC portion of the POR circuit that might also be present. If no AC detection is provided in the chip's POR circuit, slow rise and fall times are not absolutely necessary, and the method may be modified appropriately, e.g., to speed up testing.

The method may be applied to a variety of integrated circuits having any of a variety of POR circuitry. Moreover, the method may be executed with any of a variety of chip test equipment, provided the power supply voltage can be lowered and raised continuously without momentary switching interruptions. Given a particular chip tester, the test routine is modified to include a test flow in accord with the present invention in addition to the other chip tests already provided to the test equipment.

With reference to FIG. 1, an exemplary test flow is seen. Prior to this test flow, the initial powering up of the chip should cause the circuitry to assume a normal reset state. The tester can check whether this is so. This is a preliminary test of any AC portion of the POR circuit or, if only a DC voltage detector is provided, of the POR circuit under normal (VCC=0V to $V_H$) power-up conditions. After this basic preliminary test, a more complete testing of the POR circuitry and the receiving circuit's response can begin. Other tests of the chip may be provided either before or after the complete testing of the POR circuitry.

The power-on reset test method of the present invention may begin, with the VCC power supply voltage at a normal high level $V_H$ (e.g., 5V), by establishing a first state of the integrated circuit being tested that is different from the normal reset state of the integrated circuit. Thus, (1) when a proper reset of the circuit occurs, the circuit assumes the normal reset state, (2) when a reset is attempted but fails to execute properly, the circuit will assume a state different from both the first state and the normal reset state, and (3) when a reset signal fails to be generated or a reset complete fails even to initiate, the circuit will remain in the established first state. The first state may be established, for example, by enabling the device (step 11) and then issuing a read command and a specified address (e.g., 0x0000) to the device's configuration memory (step 13). Driving the chip select pin CS active and the hold and write protect pins /HOLD and /WP inactive will typically enable the device and allow the command to configure the chip into the specified first state.

When testing the POR circuitry, the test equipment should leave the device being tested in a static state (step 15) while the VCC supply voltage is powered down from and then raised back to the high level. Accordingly, the chip select pin /CS is enabled and the system clock SCK is held low. All other input pins other than the power supply pin VCC should also be held at their existing levels (typically, 0V if the logic level is low and to track VCC if the logi level is high) to avoid causing spurious changes in the device state.

The VCC power supply voltage is lowered (step 17) to a specified level $V_P$ then raised back (step 21) to the normal high voltage level $V_H$. If the POR circuitry of the chip has an AC VCC detector, the power down ramp and power up ramp and the transition (step 19) between the two should be such as to not trigger the AC portion of the POR circuit. Accordingly, a preferred embodiment for the case of the POR having an AC portion, involves powering down from over at least 10 ms, holding at the low VCC level $V_P$ for another 10 ms, then powering up again over at another 10 ms. If no AC portion is provided, then this very slow rate is optional.

FIG. 2A shows the lowering of the power supply voltage VCC from a normal high voltage level (e.g., 5.0 Volts) to some specified lower voltage level (e.g., 1.0 Volts). In this example, the lower voltage level is below the trip point $V_{trip}$ (e.g., 1.5 Volts) for the DC VCC detector of the POR circuitry. FIG. 2E shows a clock signal CK being suspended during the lowering and raising of the VCC voltage. The clock signal CK begins again when resuming dynamic operation of the chip after the VCC voltage has returned to the normal high voltage level, e.g., to check the resultant chip state. FIGS. 2B-2D represent different embodiments of a power-on reset enable signal for various known types of POR circuitry. In the example of FIG. 2B, a reset signal PORH is at zero volts unless the VCC voltage is at or below the trip point, in which case PORH tracks VCC. In another example, FIG. 2C, the POR circuitry generates reset signals PORH' when the VCC voltage passes through the trip point. The peak pulse amplitude can be at $V_{trip}$ or some other voltage level. Yet other embodiments may generate only one reset signal, either when falling below $V_{trip}$ or when returning above $V_{trip}$ but not both. In the example of FIG. 2D, a low reset signal PORL tracks VCC while it is above the trip point, then drops completely to 0V for a reset whenever VCC falls below $V_{trip}$. Whichever reset signal is generated by the POWR circuitry, the receiving circuitry is intended to respond to the reset signal and attempt to reset the chip state to a known reset state. Failures of the POR circuitry to generate a reset signal or failures of the receiving circuitry to properly reset need to be identified.

Next, the test equipment determines the state of the chip and whether or not it is still in the established first state or attempted a reset. This can be done, for example, by resuming dynamic operation of the chip that had been suspended in step 15 and reading some indication of the chip state (e.g., the value stored in a designated byte in a memory array or in one or more registers, etc.). (step 23) The results of this read of the chip state and a comparison with the originally established first state will determine (step 25) whether a resetting operation has occurred. If it is determined (step 27) that the device did not reset at the lower limit (VCC=$V_P$) of the power down and is still in the first state, this reset test is designated (step 29) as having failed. If it is determined that the device is no longer in the first state, and therefore did attempt to reset at the lower VCC limit for this test (step 31), then the test equipment may next determine (step 33) whether or not the chip has assumed a proper reset state or is in some other state. Comparing the chip's state with the reset state (step 35), if the chip is not in the reset state, the chip may be designated as having failed to properly reset (step 39). If the chip is in the reset state, the chip is designated as having passed this reset test (step 41).

A battery of multiple reset tests can be conducted under a variety operating conditions, most notably with various lower limits $V_P$. Other conditions that might affect the reset trip point $V_{trip}$ of the VCC detectors, such as temperature, could also be tested. One possible battery of tests might include repeating the reset test at successively lower levels $V_P'$, in order in order to characterize the trip point $V_{trip}$. It may also identify flaws in the resetting circuitry in which at some lower power supply levels $V_P'$ the receiving circuitry fails to reset properly to the correct reset state or fail to reset at all. These characterizations can be used as a basis for pass/fail designations of an individual chip or for establishing operating parameters for guiding system designs using the chips.

What is claimed is:

1. A method comprising:
    establishing a first state of an integrated circuit with a supply voltage at a high level, the first state being different from a reset state;
    lowering the supply voltage to successively lower specified levels until the integrated circuit has assumed the reset state;
    raising the supply voltage after the supply voltage has been lowered to each specified level;
    determining if the integrated circuit is in the reset state; and
    determining a trip level of the supply voltage from the specified level at which the integrated circuit assumed the reset state.

2. The method as in claim 1, wherein:
    raising the supply voltage comprises raising the supply voltage to the high level after the supply voltage has been lowered to each specified level.

3. The method as in claim 1, further comprising lowering the supply voltage and raising the supply voltage under a variety of operating conditions of the integrated circuit.

4. The method as in claim 1, wherein determining if the integrated circuit is in the reset state includes determining if the integrated circuit is in the reset state or a state other than the reset state.

5. A method comprising:
    establishing a first state of an integrated circuit with a supply voltage at a high level, the first state being different from a reset state;
    lowering the supply voltage to successively lower specified levels until the integrated circuit has assumed the reset state, the supply voltage being lowered at a rate to avoid triggering a reset signal from an AC portion of the integrated circuit;
    raising the supply voltage to the high level after the supply voltage has been lowered to each specified level, the supply voltage being raised at a rate to avoid triggering the reset signal from the AC portion of the integrated circuit;
    determining if the integrated circuit is in the reset state; and
    identifying a trip level of the supply voltage from the specified level for which the integrated circuit has assumed the reset state.

6. The method as in claim 5, further comprising lowering the supply voltage and raising the supply voltage under a variety of operating conditions of the integrated circuit.

7. The method of claim 5, further comprising:
    passing a reset test of the integrated circuit if the integrated circuit has assumed the reset state in response to a signal from power-on reset circuitry in the integrated circuit; and
    failing the reset test of the integrated circuit if the integrated circuit is in the first state or has assumed states other than the reset state.

8. The method of claim 5, further comprising:
    raising the supply voltage to the high level with a rise time to trigger the AC portion of the integrated circuit before establishing the first state such that the integrated circuit assumes the reset state;
    determining if the integrated circuit has assumed the reset state;
    establishing the first state if the integrated circuit has assumed the reset state; and
    failing a reset test of the integrated circuit if the integrated circuit has not assumed the reset state.

9. A method comprising:
    operating an integrated circuit in a first state with a supply voltage that is at a high voltage level;
    lowering the supply voltage to a lowered voltage level;
    raising the supply voltage to the high voltage level; and
    determining whether the integrated circuit is in a reset state comprising
        determining an operating state of the integrated circuit;
        passing a reset test of the integrated circuit if the operating state of the integrated circuit is the reset state; and
        failing the reset test of the integrated circuit if the operating state of the integrated circuit is the first state or is not the reset state, the first state being different from the reset state.

10. The method of claim 9, further comprising, for each of a plurality of different reduced voltage levels:
    operating the integrated circuit at the high voltage level;
    lowering the supply voltage to the reduced voltage level;
    raising the supply voltage to the high voltage level; and
    determining whether the integrated circuit is in the reset state.

11. The method of claim 10, further comprising, for selected ones of the reduced voltage levels, changing a temperature of the integrated circuit before lowering the supply voltage.

12. The method of claim 10, further comprising:
    determining whether a power-on reset circuit put the integrated circuit into the reset state for each reduced voltage level; and
    identifying flaws in the integrated circuit if the integrated circuit fails to assume the reset state for one or more of the reduced voltage levels.

13. The method of claim 9, further comprising:
    lowering the supply voltage to successively lower voltage levels and raising the supply voltage to the high voltage level between each lower voltage level until the integrated circuit has assumed the reset state; and
    determining a trip voltage level from the lower voltage level for which the integrated circuit entered the reset state.

14. The method of claim 9, wherein determining whether the integrated circuit is in a reset state includes:
    determining whether a resetting operation has occurred; and
    determining whether the integrated circuit has assumed the reset state.

15. The method of claim 9, wherein operating an integrated circuit in a first state with a supply voltage that is at a high voltage level includes:
    enabling the integrated circuit;
    issuing a command to the integrated circuit; and
    leaving the integrated circuit in a static state.

16. The method of claim 9, wherein determining whether the integrated circuit is in a reset state includes determining whether a power-on reset circuit generated a reset signal to set the integrated circuit to a known state.

17. The method of claim 9, wherein:
    lowering the supply voltage to a lowered voltage level includes:
        lowering the supply voltage to the lowered voltage level over a first period of time; and
        holding the supply voltage to the lowered voltage level over a second period of time; and
    raising the supply voltage to the high voltage level includes raising the supply voltage to the high voltage level over a third period of time.

18. The method of claim 17, wherein:
    the first period of time is 10 ms;
    the second period of time is 10 ms; and
    the third period of time is 10 ms.

19. The method of claim 9, further comprising suspending a clock signal in the integrated circuit when the supply voltage is being lowered and raised.

20. The method of claim 9, further comprising raising a reset signal when the supply voltage is less than or equal to a trip level of the supply voltage.

21. The method of claim 9, further comprising generating a reset signal when the supply voltage falls below a trip level of the supply voltage.

22. The method of claim 9, further comprising generating a reset signal when the supply voltage rises above a trip level of the supply voltage.

23. The method of claim 9, further comprising lowering a reset signal when the supply voltage is less than a trip level of the supply voltage.

* * * * *